United States Patent
Wan et al.

(10) Patent No.: US 10,189,188 B2
(45) Date of Patent: Jan. 29, 2019

(54) NANOIMPRINT LITHOGRAPHY ADHESION LAYER

(71) Applicant: Canon Kabushiki Kaisha, Tokyo (JP)

(72) Inventors: Fen Wan, Austin, TX (US); Weijun Liu, Cedar Park, TX (US); Timothy Brian Stachowiak, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 15/160,870

(22) Filed: May 20, 2016

(65) Prior Publication Data

US 2017/0335150 A1 Nov. 23, 2017

(51) Int. Cl.
G03F 7/004 (2006.01)
C08G 8/36 (2006.01)
G03F 7/00 (2006.01)
B29C 35/08 (2006.01)
B29C 43/20 (2006.01)
G03F 7/11 (2006.01)
B29L 9/00 (2006.01)

(52) U.S. Cl.
CPC ........ B29C 35/0805 (2013.01); B29C 43/203 (2013.01); C08G 8/36 (2013.01); G03F 7/0002 (2013.01); G03F 7/004 (2013.01); G03F 7/11 (2013.01); B29L 2009/005 (2013.01)

(58) Field of Classification Search
CPC .................................. C08G 3/86; G03F 7/004
See application file for complete search history.

(56) References Cited

U.S. PATENT DOCUMENTS

| | | | | |
|---|---|---|---|---|
| 3,301,743 A * | 1/1967 | Fekete | .................... | C07C 67/26 252/511 |
| 3,882,003 A * | 5/1975 | Mani | ................... | C08F 299/026 522/103 |
| 3,919,349 A * | 11/1975 | Young | ................ | C08G 59/4292 525/502 |
| 4,159,285 A * | 6/1979 | Passalenti | ............... | C08L 63/10 525/502 |
| 4,690,987 A * | 9/1987 | Sakakibara | ........ | C08G 18/6705 522/92 |
| 4,769,437 A * | 9/1988 | Blount | ................... | C08G 65/34 521/123 |
| 5,015,701 A * | 5/1991 | Domeier | ............. | C08F 299/026 523/466 |
| 6,873,087 B1 | 3/2005 | Choi et al. | | |
| 6,932,934 B2 | 8/2005 | Choi et al. | | |
| 6,936,194 B2 | 8/2005 | Watts | | |
| 7,077,992 B2 | 7/2006 | Sreenivasan et al. | | |
| 7,197,396 B2 | 3/2007 | Stopczynski | | |
| 7,396,475 B2 | 7/2008 | Sreenivasan | | |
| 8,349,241 B2 | 1/2013 | Sreenivasan et al. | | |
| 8,557,351 B2 | 10/2013 | Xu | | |
| 2004/0065252 A1 | 4/2004 | Sreenivasan et al. | | |
| 2008/0110557 A1 | 5/2008 | Xu | | |
| 2010/0233628 A1 * | 9/2010 | Akita | ...................... | C07C 69/00 430/286.1 |
| 2011/0065612 A1 * | 3/2011 | Stokes | .................... | C02F 1/682 507/244 |
| 2014/0034229 A1 | 2/2014 | Xu | | |

* cited by examiner

Primary Examiner — Liam J Heincer
(74) Attorney, Agent, or Firm — Fish & Richardson P.C.

(57) ABSTRACT

A compound of Formula A-1:

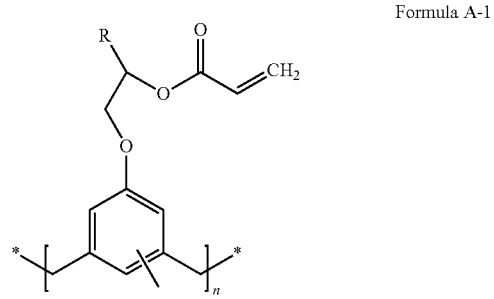

Formula A-1 where n is an integer and R is $C_{1\text{-}10}$ alkyl. In some cases, n is an integer of 1 to 20 or 5 to 15. R may be substituted or unsubstituted. An adhesive composition may include a compound of Formula A-1. The adhesive composition may include at least one of a crosslinker, a catalyst, and a solvent. An imprint lithography stack may include a substrate and an adhesion layer adhered to the substrate, where the adhesion layer includes a compound of Formula A-1. Forming an adhesion layer on an imprint lithography substrate includes disposing an adhesive composition on the imprint lithography substrate and polymerizing the adhesive composition to yield the adhesion layer on the substrate, where the adhesive composition includes a compound of Formula A-1, where n is an integer and R is $C_{1\text{-}10}$ alkyl.

20 Claims, 2 Drawing Sheets

NANOIMPRINT LITHOGRAPHY ADHESION LAYER

TECHNICAL FIELD

This invention relates to a nanoimprint lithography adhesion layer formulated to increase adhesion between a nanoimprint lithography substrate and an imprint resist.

BACKGROUND

As the semiconductor processing industry strives for larger production yields while increasing the number of circuits per unit area, attention has been focused on the continued development of reliable high-resolution patterning techniques. One such technique in use today is commonly referred to as imprint lithography. Imprint lithography processes are described in detail in numerous publications, such as U.S. Patent Application Publication No. 2004/0065252, and U.S. Pat. Nos. 6,936,194 and 8,349,241, all of which are incorporated by reference herein. Other areas of development in which imprint lithography has been employed include biotechnology, optical technology, and mechanical systems.

An imprint lithography technique disclosed in each of the aforementioned patent documents includes formation of a relief pattern in an imprint resist and transferring a pattern corresponding to the relief pattern into an underlying substrate. The patterning process uses a template spaced apart from the substrate and a polymerizable composition ("imprint resist" or "resist") disposed between the template and the substrate. In some cases, the imprint resist is disposed on the substrate in the form of discrete, spaced-apart drops. The drops are allowed to spread before the imprint resist is contacted with the template. After the imprint resist is contacted with the template, the resist is allowed to uniformly fill the space between the substrate and the template, then the imprint resist is solidified to form a layer that has a pattern conforming to a shape of the surface of the template. After solidification, the template is separated from the patterned layer such that the template and the substrate are spaced apart.

An adhesion layer is typically used to promote the bonding between the imprint resist and the substrate, thereby reducing delamination of the patterned layer from the substrate One way to reduce the separation force is addition of a release agent to the resist to form a thin layer of lubricant between the resist and the template. However, even with a release agent, delamination may still occur.

SUMMARY

A first general aspect includes a compound of Formula A-1:

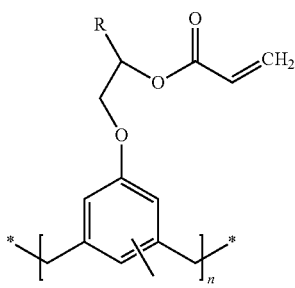

Formula A-1 where n is an integer and R is $C_{1-10}$ alkyl.

Implementations of the first general aspect may include one or more of the following features.

In some cases, n is an integer of 1 to 20. In certain cases, n is an integer of 5 to 15. R may be substituted or unsubstituted.

In a second general aspect, a composition includes a compound of Formula A-1.

Implementations of the second general aspect may include one or more of the following features.

In some cases, n is an integer of 1 to 20. In certain cases, n is an integer of 5 to 15. R may be substituted or unsubstituted.

The composition may include a crosslinker. The crosslinker may include an alkylated melamine. In some cases, the composition includes from about 1 wt % to about 50 wt % of the crosslinker.

The composition may include a catalyst. The catalyst may include a benzenesulfonic acid based catalyst. In some cases, the composition comprises up to about 10 wt % of the catalyst.

The composition may include a solvent. The solvent may include 2-(1-methoxy)propyl acetate. In some cases, the composition includes from about 30 wt % to about 90 wt % or from about 60 wt % to about 90 wt % of the solvent.

In a third general aspect, an imprint lithography stack includes a substrate and an adhesion layer adhered to the substrate. The adhesion layer is formed from a composition including a compound of Formula A-1, where n is an integer and R is $C_{1-10}$ alkyl.

Implementations of the third general aspect may include one or more of the following features.

The imprint lithography stack may include a polymeric layer adhered to the adhesion layer. In some cases, a thickness of the adhesion layer is in a range between 2 nm and 10 nm. In certain cases, the surface free energy of the substrate exceeds the surface free energy of the adhesion layer.

In a fourth general aspect, forming an adhesion layer on an imprint lithography substrate includes disposing an adhesive composition on the imprint lithography substrate and polymerizing the adhesive composition to yield the adhesion layer on the substrate. The adhesive composition includes a compound having Formula A-1, where n is an integer and R is $C_{1-10}$ alkyl.

Implementations of the fourth general aspect may include one or more of the following features.

In some cases, n is an integer of 1 to 20. In certain cases, n is an integer of 5 to 15. R may be substituted or unsubstituted.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Figure 1:
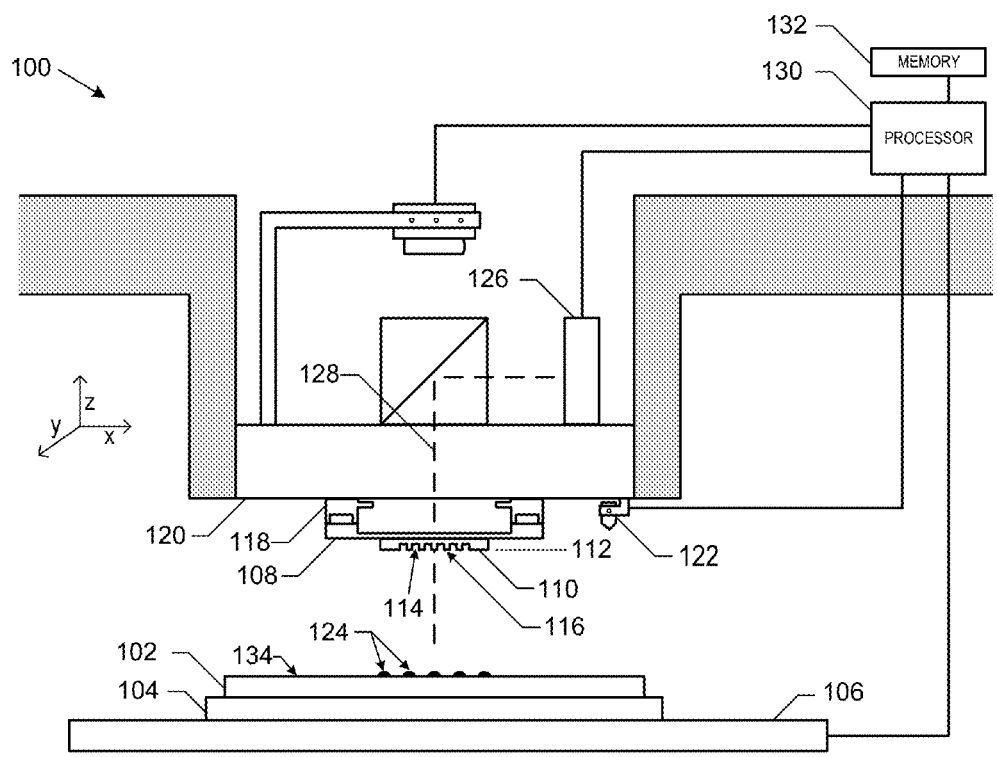
FIG. 1 depicts a simplified side view of a lithographic system.

FIG. 1 depicts an imprint lithographic system 100 of the sort used to form a relief pattern on substrate 102. Substrate 102 may include a base and an adhesion layer adhered to the base. The adhesion layer may be spun on to the surface of substrate 102 to increase the adhesion between the substrate and imprint resist 124. Substrate 102 may be coupled to substrate chuck 104. As illustrated, substrate chuck 104 is a vacuum chuck. Substrate chuck 104, however, may be any chuck including, but not limited to, vacuum, pin-type, groove-type, electromagnetic, and/or the like. Exemplary chucks are described in U.S. Pat. No. 6,873,087, which is incorporated by reference herein. Substrate 102 and substrate chuck 104 may be further supported by stage 106. Stage 106 may provide motion about the x-, y-, and z-axes. Stage 106, substrate 102, and substrate chuck 104 may also be positioned on a base.

Spaced apart from substrate 102 is a template 108. Template 108 generally includes a rectangular or square mesa 110 some distance from the surface of the template towards substrate 102. A surface of mesa 110 may be patterned. In some cases, mesa 110 is referred to as mold 110 or mask 110. Template 108, mold 110, or both may be formed from such materials including, but not limited to, fused silica, quartz, silicon, silicon nitride, organic polymers, siloxane polymers, borosilicate glass, fluorocarbon polymers, metal (e.g., chrome, tantalum), hardened sapphire, or the like, or a combination thereof. As illustrated, patterning of surface 112 includes features defined by a plurality of spaced-apart recesses 114 and protrusions 116, though embodiments are not limited to such configurations. Patterning of surface 112 may define any original pattern that forms the basis of a pattern to be formed on substrate 102.

Template 108 is coupled to chuck 118. Chuck 118 is typically configured as, but not limited to, vacuum, pin-type, groove-type, electromagnetic, or other similar chuck types. Exemplary chucks are further described in U.S. Pat. No. 6,873,087, which is incorporated by reference herein. Further, chuck 118 may be coupled to imprint head 120 such that chuck 118 and/or imprint head 120 may be configured to facilitate movement of template 108.

System 100 may further include a fluid dispense system 122. Fluid dispense system 122 may be used to deposit imprint resist 124 on substrate 102. When adhesion layer is present on the surface of the substrate, imprint resist 124 may be deposited onto the adhesion layer. Imprint resist 124 may be dispensed upon substrate 102 using techniques such as drop dispense, spin-coating, dip coating, chemical vapor deposition (CVD), physical vapor deposition (PVD), thin film deposition, thick film deposition, or the like. In a drop dispense method, imprint resist 124 is disposed on substrate 102 in the form of discrete, spaced-apart drops, as depicted in FIG. 1.

System 100 may further include an energy source 126 coupled to direct energy along path 128. Imprint head 120 and stage 106 may be configured to position template 108 and substrate 102 in superimposition with path 128. System 100 may be regulated by a processor 130 in communication with stage 106, imprint head 120, fluid dispense system 122, and/or source 126, and may operate on a computer readable program stored in memory 132.

Imprint head 120 may apply a force to template 108 such that mold 110 contacts imprint resist 124. After the desired volume is filled with imprint resist 124, source 126 produces energy (e.g., electromagnetic radiation or thermal energy), causing imprint resist 124 to solidify (e.g., polymerize and/or crosslink), conforming to the shape of surface 134 of substrate 102 and patterning surface 112. After solidification of imprint resist 124 to yield a polymeric layer on substrate 102, mold 110 is separated from the polymeric layer.

Figure 2:
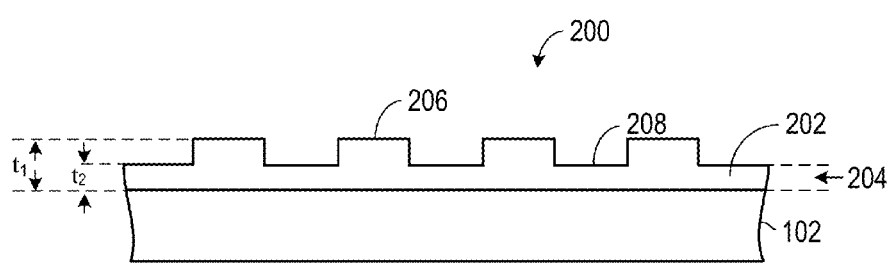
FIG. 2 depicts a simplified side view of the substrate shown in FIG. 1, with a patterned layer formed on the substrate.

FIG. 2 depicts nanoimprint lithography stack 200 formed by solidifying imprint resist 124 to yield patterned polymeric layer 202 on substrate 102. Patterned layer 202 may include a residual layer 204 and a plurality of features shown as protrusions 206 and recesses 208, with protrusions 206 having a thickness $t_1$ and residual layer 204 having a thickness $t_2$. In nanoimprint lithography, a length of one or more protrusions 206, recessions 208, or both parallel to substrate 102 is less than 100 nm, less than 50 nm, or less than 25 nm. In some cases, a length of one or more protrusions 206, recessions 208, or both is between 1 nm and 25 nm or between 1 nm and 10 nm.

The above-described system and process may be further implemented in imprint lithography processes and systems such as those referred to in U.S. Pat. Nos. 6,932,934; 7,077,992; 7,197,396; and 7,396,475, all of which are incorporated by reference herein.

Substrate 102 may be formed from a number of different materials. In some examples, the substrate may be formed from silicon, plastics, gallium arsenide, mercury telluride, and composites thereof. The substrate may include one or more layers, e.g., dielectric layer, metal layer, semiconductor layer, planarization layer, and the like, upon which imprint resist 124 is deposited. In some embodiments, the surface of the substrate includes silicon (Si), silicon oxide (e.g., SiO, $SiO_2$), or spin-on-glass (SOG), spin-on-carbon (SOC). In certain embodiments, the average number per unit of hydroxyl groups (—OH) on the surface of the substrate is less than the number of hydroxyl groups on the surface of a $SiO_x$ substrate, wherein x is between 0.5 and 2.5 (e.g., 0.5, 1, 2, or 2.5).

In some cases, the surface of the substrate does not include polar groups (e.g., hydroxyl groups) as determined by conventional analytical techniques. The surface free energy of the substrate may be from about 20 mN/m to about 70 mN/m, from about 30 mN/m to about 60 mN/m, or from about 40 mN/m to about 50 mN/m as determined by the Owens-Wendt method. In some cases, the surface free energy of the substrate is about 65 mN/m or less, about 60 mN/m or less, about 55 mN/m or less, about 50 mN/m or less, about 45 mN/m or less, about 40 mN/m or less, or about 30 mN/m or less as determined by the Owens-Wendt method. The surface free energy of the substrate may be lower than the surface free energy of a Si substrate, a SiO substrate, or a $SiO_2$ substrate.

In some embodiments, the contact angle of water on the substrate surface is from about 10° to about 100°, from about 20° to about 90°, from about 30° to about 80°, from about 40° to about 70°, or from about 50° to about 60°. The contact angle of water on the substrate surface may be about 20° or more, about 30° or more, about 40° or more, about 50° or more, about 60° or more, about 70° or more, about 80° or more, about 90° or more, or about 100° or more.

Imprint resist 124 may include a variety of different polymerizable components. In some examples, an imprint resist includes polymerizable monomers such as vinyl ethers, methacrylates, epoxies, thiol-enes and acrylates.

An exemplary imprint resist includes isobornyl acrylate, n-hexyl acrylate, ethylene glycol diacrylate, and 2-hydroxy- 2-methyl-1-phenyl-propan-1-one. The acrylate component, isobornyl acrylate (IBOA), has the following structure:

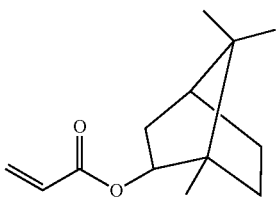

and comprises approximately 47 wt % of the imprint resist, but may be present in a range of 20 wt % to 80 wt %. As a result, the mechanical properties of formation 50 may be primarily attributable to IBOA. An exemplary source for IBOA is Sartomer Company, Inc. of Exton, Pa., available under the product name SR 506.

The component n-hexyl acrylate (n-HA) has the following structure:

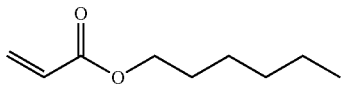

and comprises approximately 25 wt % of the imprint resist, but may be present in a range of 0 wt % to 50 wt %. n-HA may provide flexibility to formation 50, and reduce the viscosity of the imprint resist, so that the imprint resist, in the liquid phase, has a viscosity in a range of about 2 cP to about 20 cP or about 5 cP to about 10 cP at room temperature. An exemplary source for the n-HA component is the Aldrich Chemical Company of Milwaukee, Wis.

A crosslinking component, ethylene glycol diacrylate (EGDA), has the following structure:

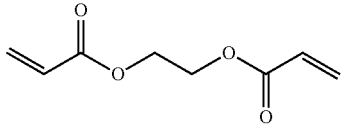

and comprises approximately 25 wt % of the imprint resist, but may be present in a range of 10 wt % to 50 wt %. EGDA contributes to the modulus and stiffness buildup, as well as facilitates crosslinking of n-HA and IBOA during polymerization of the imprint resist.

In some embodiments, an imprint resist may include at least one of an aliphatic urethane acrylate and 1,6-hexanediol diacrylate.

An aliphatic urethane acrylate component may comprise between about 0 wt % and about 50 wt % of an imprint resist. Aliphatic urethane acrylate components are available from Rahn USA Corp., Aurora, Ill., under the designation Genomer 1122 and has the following structure:

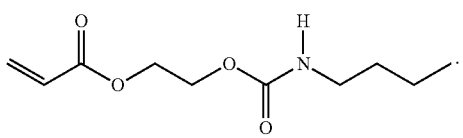

1,6-hexanediol diacrylate is available from UCB Chemicals, Smyna, Ga., under the designation HDODA and has the following structure:

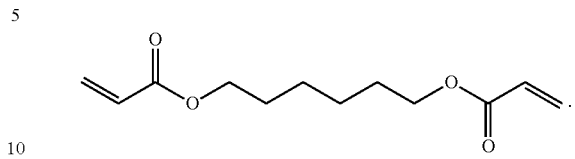

1,6-hexanediol diacrylate may comprise between about 10 wt % and about 50 wt % of an imprint resist. 1,6-hexanediol diacrylate may be used as a main component of the imprint resist and also as a crosslinking component.

Other acrylate components may also be utilized in the imprint resist composition.

2-hydroxy-2-methyl-1-phenyl-propan-1-one, an exemplary initiator, is available from Ciba Specialty Chemicals of Tarrytown, N.Y. under the trade name DAROCUR® 1173, and has the following structure:

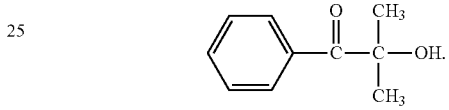

2-hydroxy-2-methyl-1-phenyl-propan-1-one may comprise approximately 3 wt % of the imprint resist, but may be present in a range of 1 wt % to 5 wt %. The actinic energy to which the initiator is responsive is broadband ultraviolet energy generated by a medium-pressure mercury lamp. In this manner, the initiator facilitates crosslinking and polymerization of the components of the imprint resist.

The imprint resist may have certain characteristics to facilitate rapid and even filling of the features of substrate 102 and mold 110. To that end, the viscosity of the imprint resist can be established, based upon the deposition process employed, to achieve the aforementioned characteristics. As mentioned above, the imprint resist may be deposited on substrate 102 employing various techniques. When the imprint resist is deposited as a plurality of discrete and spaced-apart droplets, the imprint resist typically has a relatively low viscosity, e.g., from about 0.5 cP to about 30 cP, or from about 0.5 cP to about 20 cP at room temperature. When the imprint resist is deposited employing spin-coating techniques, the imprint resist typically has a viscosity greater than 10 cP (e.g., up to 100 cP or several thousand cP at room temperature, with the viscosity measurement being determined in the absence of a solvent.

As mentioned above, upon exposure to energy (e.g., electromagnetic radiation, such as UV radiation, or thermal energy), the imprint resist 124 solidifies. In addition to the aforementioned characteristics (referred to as liquid phase characteristics), generally, a solidified imprint resist typically demonstrates certain solidified phase characteristics. For example, after solidification of the imprint resist, the preferential adhesion and release characteristics are generally determined by the composition of the imprint resist.

As for preferential adhesion, for example, after deposition of the imprint resist and upon separation of mold 110, the solidified imprint resist is subjected to a separation force $F_S$. The separation force $F_S$ is attributable to a pulling force $F_P$ on mold 110 and adhering forces $F_{A2}$, e.g., Van der Waals forces, between the solidified imprint resist and mold 110.

Pulling force $F_P$ is used to break the vacuum seal. It is desired that $F_{A2}$ typically have a magnitude that is less than the magnitude of an adhering force $F_{A1}$ between the solidified imprint resist and substrate 102. Should adhering force, $F_{A2}$, approach the magnitude of the adhering force $F_{A1}$, distortion and/or delamination of the solidified imprint resist from substrate 102 may occur. The ratio of adhering force $F_{A1}$ to separation force $F_{A2}$ (referred as the force ratio, $F_R$) can be at least about 2:1 and, more advantageously, at least about 5:1. In some embodiments, $F_R$ is at least about 6:1, at least about 7:1, at least about 8:1, at least about 9:1, at least about 10:1, at least about 20:1, or at least about 50:1. In this manner, efficient decoupling of mold 110 from the solidified imprint resist may be performed without unduly distorting the patterned layer.

The adhesive composition described herein prevents or avoids delamination of solidified imprint resist from a substrate by forming an adhesion layer that yields an adhering force between the substrate and the solidified imprint resist that exceeds the separation force $F_S$.

In the presence of adhesion, a more complex situation exists due at least in part to the presence of the first interface between the adhesion layer and the solidified imprint resist and the second interface between the adhesion layer and the substrate. At the first interface, a first adhering force $F_1$ is present between the adhesion layer and the solidified imprint resist. At the second interface, a second adhering force, $F_2$, is present between the adhesion layer and the substrate. It is desired that the mold adhesion force $F_{A2}$ have a magnitude that is less than either of adhering forces $F_1$ and $F_2$. (The lesser of $F_1$ and $F_2$ is $F_{A1}$, as this is the force with which the solidified imprint resist is adhered to the substrate). Otherwise, delamination of the solidified imprint resist from the adhesion layer, delamination of adhesion layer from the substrate, or both may occur.

As described herein, an adhesion layer is formed from a composition that forms strong bonds at the first interface (i.e., between the adhesion layer and the solidified imprint resist) as well as at the second interface (i.e., between the adhesion layer and the substrate). Adhesion at the first interface may be achieved via one or more mechanisms including covalent bonds, ionic bonds, Van der Waals forces, or hydrophobic interactions between the adhesion layer and the imprint resist. Adhesion between the adhesion layer and the substrate may also be achieved through one or more mechanisms including as covalent bonds, ionic bonds, Van der Waals forces, or hydrophobic interactions between the adhesion layer and the substrate. This is achieved by forming the adhesion layer from an adhesive composition that includes a multi-functional reactive compound, i.e., a compound that contains two or more functional groups generally represented as General Formula A:

General Formula A

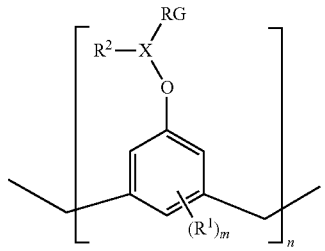

in which X is $C_{1-10}$ alkylene. As used herein, the term "$C_{1-10}$ alkylene" refers to a divalent alkyl linking group having 1 to 10 carbons. Examples of alkylene groups include, but are not limited to, ethan-1,1-diyl, ethan-1,2-diyl, propan-1,1,-diyl, propan-1,3-diyl, propan-1,2-diyl, butan-1,4-diyl, butan-1,3-diyl, butan-1,2-diyl, 2-methyl-propan-1,3-diyl, methylene, ethylene, propylene, and the like. In some embodiments, the alkylene moiety contains 2 to 6, 2 to 4, 2 to 3, 1 to 6, 1 to 4, or 1 to 2 carbon atoms. The alkylene group may be may be straight-chain or branched. In some embodiments, X is propylene.

In General Formula A, $R^1$ is $C_{1-6}$ alkyl. As used herein, "$C_{1-6}$ alkyl" refers to a saturated hydrocarbon group that may be straight-chain or branched, having 1 to 6 carbons. Examples of alkyl moieties include, but are not limited to, chemical groups such as methyl, ethyl, n-propyl, isopropyl, n-butyl, tert-butyl, isobutyl, sec-butyl; higher homologs such as 2-methyl-1-butyl, n-pentyl, 3-pentyl, n-hexyl, 1,2,2-trimethylpropyl, and the like. In some embodiments, the alkyl group contains from 1 to 6 carbon atoms, from 1 to 4 carbon atoms, from 1 to 3 carbon atoms, or 1 to 2 carbon atoms. In some embodiments, the $R^1$ group is methyl. In General Formula A, m represents the number of $R^1$ groups present in each repeating unit of General Formula A. Each $R^1$ present may be the same or different. As depicted, m may be an integer from 1 to 3.

In General Formula A, the groups $R^2$ and RG denote functional groups. $R^2$ and RG may be the same or different. One of the functional groups $R^2$ and RG, for example $R^2$, is selected to achieve cross-reaction or cross-interaction with the substrate via at least one of hydrophobic interactions, covalent bonds, and Van der Waals interactions. Another of the functional groups $R^2$ and RG, for example RG, is selected to achieve cross-reaction with the imprint resist to adhere thereto by forming at least one of covalent bonds, ionic bonds, and Van der Waals interactions.

In some embodiments, $R^2$ is $C_{1-6}$ alkyl, which may be straight-chain or branched, having 1 to 6 carbons. Examples of alkyl moieties of $R^2$ include, but are not limited to, chemical groups such as methyl, ethyl, n-propyl, isopropyl, n-butyl, tert-butyl, isobutyl, sec-butyl; higher homologs such as 2-methyl-1-butyl, n-pentyl, 3-pentyl, n-hexyl, 1,2,2-trimethylpropyl, and the like. In some embodiments, the $R^2$ group contains from 1 to 6 carbon atoms, from 1 to 4 carbon atoms, from 1 to 3 carbon atoms, or 1 to 2 carbon atoms. In some embodiments, the $R^2$ group is ethyl.

In some embodiments, RG is a reactive group that participates in the crosslinking and polymerization reactions of the adhesion layer. Typically, RG functional groups facilitate polymerization and crosslinking in response to an actinic energy such as ultraviolet irradiation, infrared irradiation, or irradiation with visible light. In some embodiments, actinic energy is provided as electromagnetic radiation with a wavelength from about 100 nm to about 200 nm, from about 200 nm to about 300 nm, or from about 300 nm to about 400 nm. In some embodiments, the RG groups in the present example facilitate crosslinking of molecules in the adhesion layer in response to exposure to thermal energy (e.g., baking). In some embodiments, baking is carried out from about 100° C. to about 200° C., from about 110° C. to about 190° C., from about 120° C. to about 180° C., from about 130° C. to about 170° C., or from about 140° C. to about 160° C. In some embodiments, baking is carried out at about 160° C.

RG groups may be selected to facilitate cross-reaction with the imprint resist through three mechanisms: 1) reaction with monomers in the imprint resist; 2) reaction with crosslinker molecules in the imprint resist; and 3) polymerization of and crosslinking of the adhesion layer so that chains of molecules of sufficient length may be developed to connect between the imprint resist and the substrate. In some embodiments, examples of RG groups may be vinyl ethers, methacrylates, epoxies, thiol-enes and acrylates. In some embodiments, RG has the following formula:

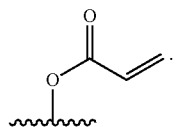

In General Formula A, n is an integer representing an average number of repeating units. In one example, n is an integer from 1 to 100 (e.g., 1 to 20, 2 to 18, 4 to 16, 8 to 14, or 10 to 12. In another example, n is an integer from 5 to 20 (e.g., 5 to 15 or 5 to 10).

In some embodiments of General Formula A, $R^1$ is methyl, m is 1, $R^2$ is ethyl, X is propylene, RG is acrylate and n is an integer between 1 and 20.

In some embodiments, General Formula A includes Formula A-1:

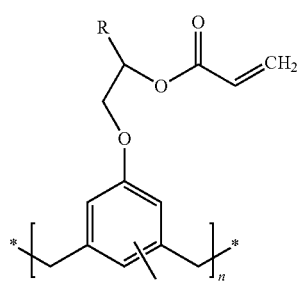

Formula A-1 where n is an integer from 1 to 20 or from 1 to 15, R is $C_{1-10}$ alkyl, and the aromatic moiety is substituted with 1 to 3 methyl groups. R may be substituted or unsubstituted.

In some embodiments, the resin of General Formula A or Formula A-1 may be prepared as described in Scheme 1, shown below, by reacting a resin containing a glycidoxy fragment with a metal-containing reagent $R^2$-M-X, where $R^2$ is an alkyl group as described herein, M is a metal, and X is a halide. In some embodiments, M is magnesium, zinc, or copper and X is Cl, Br or I. This reaction may be carried out at low temperature, such as, for example, −20° C., −10° C., or 0° C. The reaction may be carried out in a solvent, such as, for example, anhydrous ethereal solvent (e.g., dimethyl ether or diethyl ether, MBTE, diglyme, dioxane, tetrahydrofuran or the like). In some embodiments, the $R^2$-M-X reagent is a Grignard reagent, such as ethyl magnesium bromide. In some embodiments, alkyl lithium may be used in this reaction (e.g., n-BuLi or tBuLi).

Scheme 1

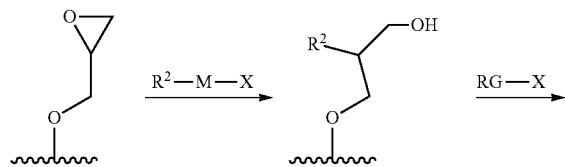

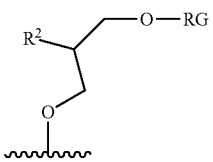

The intermediate that is formed as a result of epoxide opening may be further reacted with a reactive group-containing reagent RG-X, wherein RG is as described herein and X is a suitable leaving group such as a halide (e.g., Cl, Br, or I), or hydroxyl. This reaction may be carried out at a temperature from about 10° C. to about 70° C., from about 20° C. to about 60° C., from about 30° C. to about 50° C. In some embodiments, this reaction may be carried out at room temperature (e.g., 18° C. or 25° C.). In some embodiments, the reactive group-containing reagent RG-X is acrylic chloride, methacrylic chloride, acrylic acid or methacrylic acid.

In some embodiments, a compound of Formula A-1, where n is an integer from 1 to 20 or from 1 to 15, is synthesized by reacting Compound A-1:

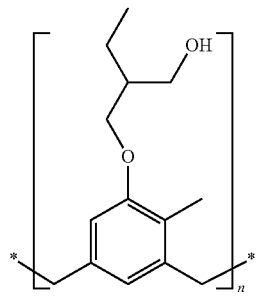

Compound A-1 with acrylic acid chloride. In some embodiments, the reaction is carried out at room temperature in the presence of triethylamine.

In some embodiments, Compound A-1 is prepared by reacting a Compound A-2:

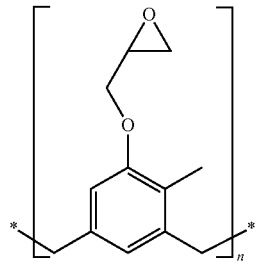

Compound A-2 with ethyl magnesium bromide. In some embodiments, the reaction is carried out in an ether solvent (e.g., dimethyl ether) at about −20° C. Compound A-2 is available as EPON Resin 164 (CAS registry number 29690-82-2).

In some embodiments, Compound A-2 is reacted with hexyl magnesium bromide to yield Compound A-3:

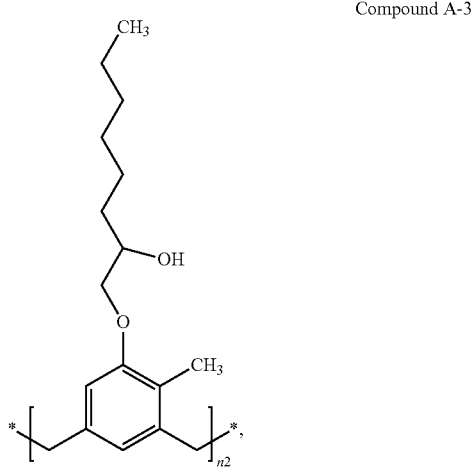

Compound A-3 where n2 is an integer from 3-15.

Compounds of Formula A-1 have relatively high hydrophobicity (high water contact angle) and low surface tension (correspondingly, low surface free energy of a film prepared by spin-coating a composition including a compound of Formula A-1). Other compounds of Formula A-1 may be prepared by similar reactions.

In some embodiments, Formula A-1 is a hydrophobic phenolformaldehyde resin prepared by a process comprising: (i) reacting glycidoxy functionalized phenol formaldehyde resin with alkyl magnesium halide to obtain an intermediate; (ii) reacting the intermediate with acrylic acid chloride to obtain the hydrophobic phenolformaldehyde resin. In some embodiments, Compound A-2 is a glycidoxy functionalized phenol formaldehyde resin as described herein. In some embodiments, the alkyl magnesium halide is ethyl magnesium bromide.

An adhesive composition used to form an adhesion layer in nanoimprint lithography may include one or more of the multi-functional reactive compounds described herein. An exemplary composition including a multi-functional reactive compound (e.g., Formula A-1) is described in Example 3.

In some embodiments, a compound of Formula A-1 is the main component of an adhesive composition used to form an adhesion layer. The adhesive composition may contain from about 30 wt % to about 95 wt %, from about 40 wt % to about 90 wt %, from about 50 wt % to about 80 wt %, or from about 60 wt % to about 90 wt % of a compound of Formula A-1. In some embodiments, the adhesive composition includes 40 wt % or more, 50 wt % or more, 60 wt % or more, 70 wt % or more, 80 wt % or more, or 90 wt % or more of a compound of Formula A-1.

The adhesive composition may contain a crosslinker, such as an alkylated melamine, in which suitable alkyl groups include methyl, ethyl, propyl, butyl or other long-chain substituent with a relatively low evaporation temperature. In some cases, the alkyl group is a leaving group when heated (e.g., to 160° C.). When the alkyl group has a longer chain, it is less likely to behave as a linking group, and more likely to require higher temperature to crosslink. On the other hand, an alkyl group with a longer chain is more hydrophobic and has lower surface tension, which may to form interactions with the hydrophobic surface of the substrate.

In one example, the evaporation or leaving of a butyl group requires a higher baking temperature or longer baking time. In such a case, different regions of the adhesion layer may demonstrate different contact angles (e.g., the imprint resist has a contact angle of less than 5° on one region of the adhesion layer and a contact angle of up to 20° on another region of the adhesion layer.) In some cases, alkyl groups with one to three carbons are preferred. Methyl, ethyl, and isopropyl typically yield similar contact angles post baking, suggesting that these groups leave the surface.

Adhesive compositions including at least one of methylated, ethylated, and isopropylated melamine are able to advantageously coat a silicon surface. In one example, an adhesive composition including propylated melamine shows no delamination post baking on a hydrophobic surface such as SOG. One such melamine is a crosslinker is sold under the product name CYMEL 303ULF, available from Allnex. A main component of CYMEL 303ULF is hexamethoxymethyl-melamine (HMMM). The methoxyl functional groups of HMMM can participate in condensation reactions. In some embodiments, an adhesive composition includes from about 0.1 wt % to about 70 wt %, from about 0.5 wt % to about 60 wt %, from about 1 wt % to about 50 wt %, from about 2 wt % to about 40 wt %, from about 3 wt % to about 30 wt %, from about 4 wt % to about 20 wt %, or from about 5 wt % to about 15 wt % of such a melamine crosslinker. In some embodiments, an adhesive composition includes from about 0.5 wt % to about 10 wt %, or from about 1 wt % to about 50 wt % of such a melamine crosslinker.

An adhesive composition may also include a polymerization catalyst. In some embodiments, a benzenesulfonic acid based catalyst is selected to trigger the polymerization upon baking. In some embodiments, the catalyst is CYCAT 4040, which is available from Cytec Industries, Inc. of West Patterson, N.J. In some embodiments, an adhesive composition includes from about 0 wt % to about 50 wt %, from about 0.1 wt % to about 40 wt %, from about 0.2 wt % to about 30 wt %, from about 0.5 wt % to about 20 wt %, or from about 1 wt % to about 10 wt % of a polymerization catalyst. In some embodiments, an adhesive composition includes from about 0.5 wt % to about 10 wt % of a polymerization catalyst. In another example, the catalyst is K-PURE TAG-2678 (e.g., 0.5 wt % to 5 wt %), available from Kings Industries, Inc.

An adhesive composition may also include a solvent. In some embodiments, the solvent is PGMEA (2-(1-methoxy) propyl acetate), available from Capital Scientific and manufactured by KMG Electronic Chemicals. Other solvents, such as diethylene glycol monoethyl ether acetate, methyl amyl ketone, or the like, may be used separately or together with one or more other solvents, such as PGMEA.

An adhesive composition may also include a surfactant. In some embodiments, an adhesive composition contains 30 wt % or less, 20 wt % or less, 10 wt % or less, 5 wt % or less, 4 wt % or less, 3 wt % or less, 2 wt % or less, or 1 wt % or less of a surfactant. In some embodiments, an adhesive composition includes about 1 wt % to about 3 wt % surfactant.

In some embodiments, an adhesive composition includes a non-surfactant compound (surface tension tuning agent) with low surface tension. This surface tension tuning agent may be volatile and typically evaporates during baking. A surface tension tuning agent may promote better coating of the substrate with an adhesive composition without changing the chemical nature of the resulting adhesion layer.

In some embodiments, an adhesive composition has a solids content of from about 0.05 wt % to about 70 wt %, from about 1 wt % to about 60 wt %, from about 2 wt % to about 50 wt %, from about 3 wt % to about 40 wt %, from about 4 wt % to about 30 wt %, from about 5 wt % to about 20 wt %, or from about 0.5 wt % to about 10 wt %. The remaining quantity is typically a solvent. The solids may include from about 50 wt % to about 99 wt % of a compound of Formula A-1, from about 1 wt % to about 50 wt % of a crosslinker, and from about 0 wt % to about 19 wt % of a catalyst, all as described herein.

In some embodiments, an adhesive composition includes: (i) a compound of Formula A-1 (15 wt % solution in PGMEA), (ii) CYMEL 303 ULF (50 wt % solution in PGMEA), (iii) K-PURE TAG 2678, and (iv) PGMEA.

An adhesive composition may be disposed upon a substrate employing spin-coating techniques. In one example, the substrate is rotated at a velocity of about 1500 revolutions per minute so as to provide a substantially smooth, if not planar layer with uniform thickness. In some embodiments, the velocity is from about 300 rpm to about 5000 rpm, from about 500 rpm to about 4000 rpm, from about 750 rpm to about 3500 rpm, from about 1000 rpm to about 3000 rpm, or from about 1500 rpm to about 2500 rpm. This is followed by exposing the adhesive composition to thermal baking energy of about 160° C. for a length of time. In some embodiments, the temperature is from about 100° C. to about 200° C., from about 110° C. to about 190° C., from about 120° C. to about 180° C., from about 130° C. to about 170° C., or from about 140° C. to about 160° C. In some embodiments, the temperature is about 160° C. In some embodiments, the exposure time is from about 10 s to about 120 s, from about 20 s to about 110 s, from about 30 s to about 100 s, from about 40 s to about 90 s, or from about 50 s to about 80 s. In some embodiments, the exposure time is about 80 s.

As described herein, a thickness of an adhesion layer is from about 0.5 nm to about 50 nm, from about 1 nm to about 40 nm, from about 2 nm to about 30 nm, from about 3 nm to about 20 nm, or from about 4 nm to about 10 nm. In some embodiments, the thickness of the adhesion layer is about 5 nm.

In some embodiments, a surface free energy of an adhesion layer is less than or comparable to the surface free energy of the substrate. In some embodiments, the surface free energy of an adhesion layer is about 70 mN/m or less, about 65 mN/m or less, about 60 mN/m or less, about 55 mN/m or less, about 50 mN/m or less, about 45 mN/m or less, about 40 mN/m or less or about 30 mN/m or less as, determined by the Owens-Wendt method.

The following examples are provided to more fully illustrate various embodiments.

EXAMPLES

Example 1: Determination of Substrate Surface Free Energy

An adhesive composition as described herein may be spun onto the surface of the substrate and cured to form an adhesion layer to increase the adhesion between the substrate and an imprint resist. Suitable substrates include Si, SiOx, SOG, SOC, and other surfaces having an appropriate hydrophobicity and surface free energy as determined by the Owens-Wendt method. Table 1 lists water contact angles for bare silicon, SOG, and SOC substrates and Owens-Wendt surface free energy for bare silicon, SOG, and SOC substrates assessed using water and diiodomethane.

TABLE 1

Water contact angles and surface free energy of different substrates.

| Substrate | Water contact angle (°) | Owens-Wendt surface free energy (mN/m) |
|---|---|---|
| Bare Si | 23.8 | 68.4 |
| SOG | 62.3 | 45.3 |
| SOC | 40.0 | 64.1 |

Example 2: Preparing a Compound of Formula A-1

Approximately 11 g of EPON 164 and 100 mL of dimethyl ether (DME) were mixed at room temperature, and cooled down to −20° C. 50 mmol EtMgBr in 50 mL DME were added and then stirred for 6 h, after which the reaction was quenched by the addition of 5 mL of water. Acrylic chloride (450 mg, 5 mmol) and trimethylamine (10 mmol) were added after the removal of water, and the reaction mixture was stirred for 2 h. The solids were removed by filtration, and then dried under vacuum. The product was re-dissolved in 200 ml of diethyl ether, and solid potassium carbonate (10 g) was added to absorb the remaining acid. After stirring for 4 h, the solid was filtered out. Compound A-1 (R=ethyl) was obtained by drying the filtrate under vacuum. In some cases, acrylic chloride can be replaced by acrylic acid. In other cases, the resin can be dissolved in PGMEA.

Example 3: Adhesive Composition

An adhesive composition including a compound of Formula A-1, CYMEL 303 ULF, K-PURE TAG 2678, and PGMEA was prepared by combining 40 g of Compound A-1 prepared in Example 2 as a 15 wt % solution in PGMEA, 3.52 g CYMEL 303 ULF as a 50 wt % solution in PGMEA), and 0.0098 g K-PURE TAG 2678, and introducing 3957 g PGMEA to yield the adhesive composition.

Example 4: Spin-Coating of Adhesive Composition on SOG Surface

Figure 3:
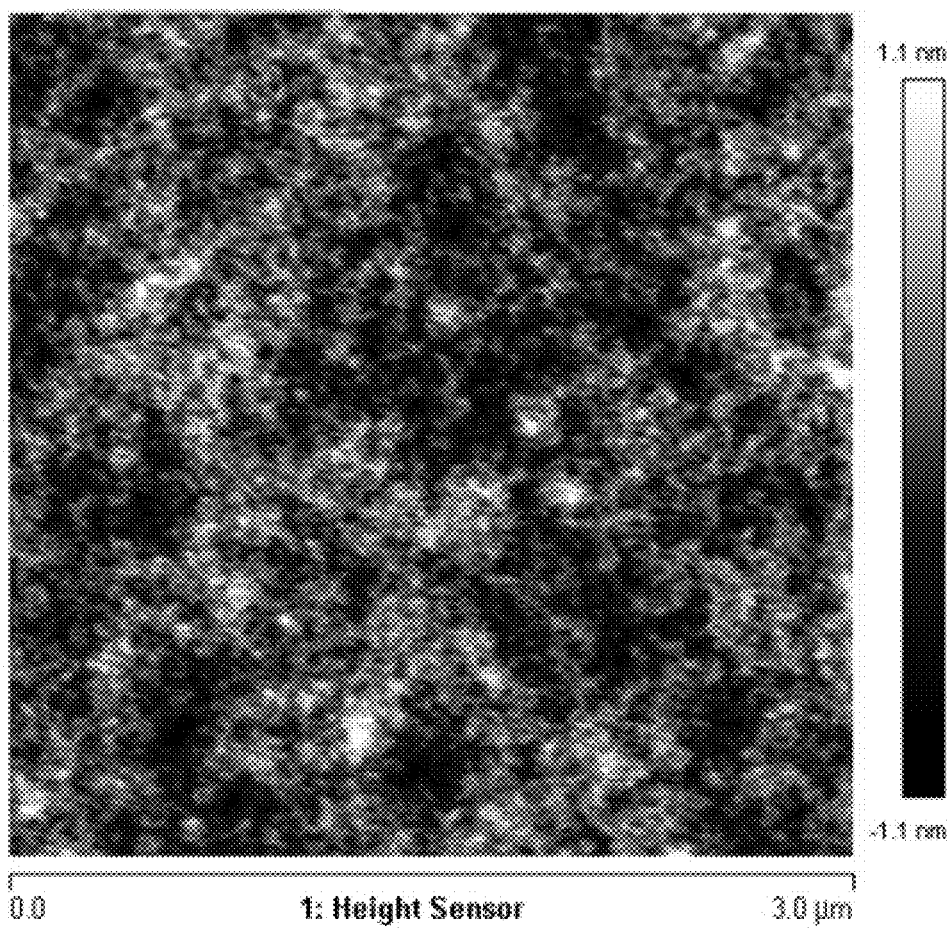
FIG. 3 shows an atomic force microscope (AFM) image of an adhesion layer on a spin-on-glass (SOG) surface.

The adhesive composition prepared in Example 3 was spin-coated on a SOG substrate under rotation of 1500 rpm and 3000 rpm/s ramp rate, and baked at 160° C. for 80 s to yield an adhesion layer having a thickness of about 5 nm. Table 2 lists water contact angles on a SOG substrate with adhesion layers formed by a commercially available adhesive composition (TRANSPIN I), and adhesive compositions prepared as described in Example 3. FIG. 3 shows an AFM image of the resulting adhesion layer.

TABLE 2

Water contact angle and surface free energy of different adhesion layers.

| Substrate | Water contact angle (°) | Owens-Wendt surface free energy (mN/m) |
|---|---|---|
| TRANSPIN I | 58.0 | 51.8 |
| Compound A-1 | 66.0 | 50.0 |
| Compound A-3 | 66.5 | 49.7 |

A number of embodiments have been described. Nevertheless, it will be understood that various modifications may be made without departing from the spirit and scope of the

What is claimed is:

1. A compound of Formula A-1:

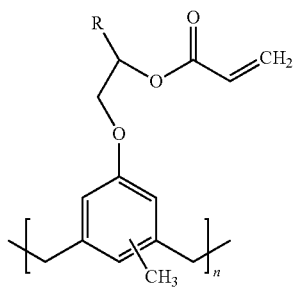

Formula A-1 wherein n is an integer and R is $C_{1-10}$ alkyl.

2. The compound of claim 1, wherein n=1 to 20.
3. The compound of claim 2, wherein n=5 to 15.
4. A composition comprising a compound of Formula A-1:

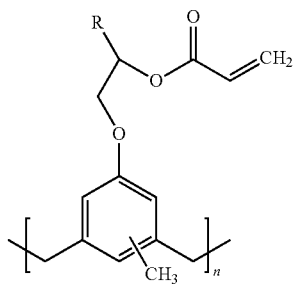

Formula A-1 wherein n is an integer and R is $C_{1-10}$ alkyl.

5. The composition of claim 4, further comprising a crosslinker.
6. The composition of claim 5, wherein the crosslinker comprises an alkylated melamine.
7. The composition of claim 5, wherein the composition comprises from about 1 wt % to about 50 wt % of the crosslinker.
8. The composition of claim 4, further comprising a catalyst.
9. The composition of claim 8, wherein the catalyst comprises a benzenesulfonic acid based catalyst.
10. The composition of claim 8, wherein the composition comprises up to about 10 wt % of the catalyst.
11. The composition of claim 4, further comprising a solvent.
12. The composition of claim 11, wherein the solvent comprises 2-(1-methoxy)propyl acetate.
13. The composition of claim 11, wherein the composition comprises from about 30 wt % to about 90 wt % or from about 60 wt % to about 90 wt % of the solvent.
14. An imprint lithography stack comprising:
   a substrate;
   an adhesion layer adhered to the substrate, wherein the adhesion layer is formed from a composition comprising a compound of Formula A-1:

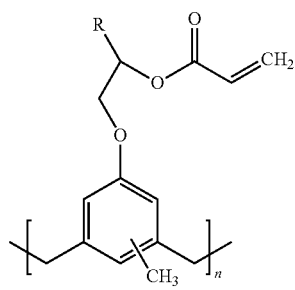

Formula A-1 wherein n is an integer and R is $C_{1-10}$ alkyl.

15. The imprint lithography stack of claim 14, wherein n=1 to 20.
16. The imprint lithography stack of claim 14, further comprising a polymeric layer adhered to the adhesion layer.
17. The imprint lithography stack of claim 14, wherein a thickness of the adhesion layer is in a range between 2 nm and 10 nm.
18. The imprint lithography stack of claim 14, wherein the surface free energy of the substrate exceeds the surface free energy of the adhesion layer.
19. A method of forming an adhesion layer on an imprint lithography substrate, the method comprising:
   disposing an adhesive composition on the imprint lithography substrate, wherein the adhesive composition comprises a compound of Formula A-1:

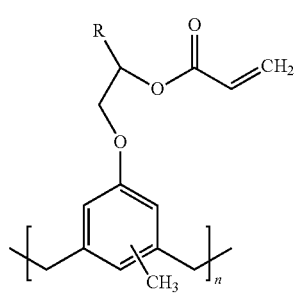

Formula A-1 wherein n is an integer and R is $C_{1-10}$ alkyl; and
   polymerizing the adhesive composition to yield the adhesion layer on the substrate.

20. The method of claim 19, wherein n=1 to 20.

* * * * *